US010234530B2

(12) United States Patent
Ookawa

(10) Patent No.: US 10,234,530 B2
(45) Date of Patent: Mar. 19, 2019

(54) MAGNETIC RESONANCE IMAGING APPARATUS

(71) Applicant: TOSHIBA MEDICAL SYSTEMS CORPORATION, Otawara (JP)

(72) Inventor: Masashi Ookawa, Nasushiobara (JP)

(73) Assignee: Toshiba Medical Systems Corporation, Otawara-shi (JP)

( * ) Notice: Subject to any disclaimer, the term of this patent is extended or adjusted under 35 U.S.C. 154(b) by 402 days.

(21) Appl. No.: 15/047,026

(22) Filed: Feb. 18, 2016

(65) Prior Publication Data

US 2016/0245891 A1  Aug. 25, 2016

(30) Foreign Application Priority Data

Feb. 23, 2015 (JP) .................................. 2015/032996
Feb. 9, 2016 (JP) .................................. 2016-022782

(51) Int. Cl.
G01R 33/565 (2006.01)
G01R 33/36 (2006.01)

(52) U.S. Cl.
CPC .... G01R 33/56518 (2013.01); G01R 33/3607 (2013.01)

(58) Field of Classification Search
CPC .................. G01R 33/3607; G01R 33/56518
See application file for complete search history.

(56) References Cited

U.S. PATENT DOCUMENTS

| 5,856,744 A * | 1/1999 | Block ............. G01R 33/56518 324/309 |
| 2004/0162483 A1 * | 8/2004 | Kimura ............ G01R 33/56308 600/419 |
| 2009/0160440 A1 | 6/2009 | Yui |
| 2012/0019251 A1 | 1/2012 | Umeda et al. |
| 2013/0082704 A1 * | 4/2013 | Grodzki ............. G01R 33/5659 324/309 |
| 2014/0239950 A1 | 8/2014 | Ookawa |

FOREIGN PATENT DOCUMENTS

| JP | 2012-40362 | 3/2012 |
| JP | 2013-176672 | 9/2013 |
| JP | 2014-161499 | 9/2014 |

* cited by examiner

*Primary Examiner* — Gregory H Curran
(74) *Attorney, Agent, or Firm* — Oblon, McClelland, Maier & Neustadt, L.L.P.

(57) ABSTRACT

In one embodiment, an MRI apparatus includes a gradient generation circuit configured to apply a gradient pulse according to a pulse sequence in which application of an RF pulse and application of the gradient pulse are included; and an RF transmission circuit configured to (a) perform modulation on a controlled output waveform of the RF pulse in such a manner that the controlled output waveform of the RF pulse follows time variation of a magnetic resonance frequency caused by time variation of an eddy-current magnetic field estimated from a waveform of the gradient pulse and (b) apply the RF pulse subjected to the modulation to an object.

7 Claims, 8 Drawing Sheets

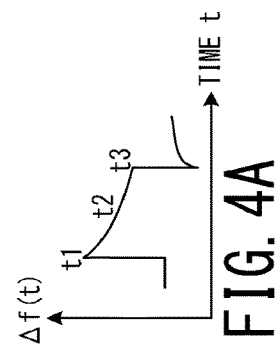
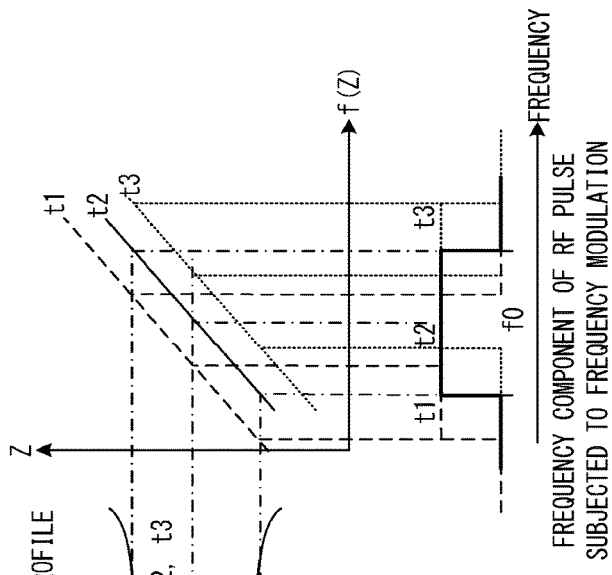
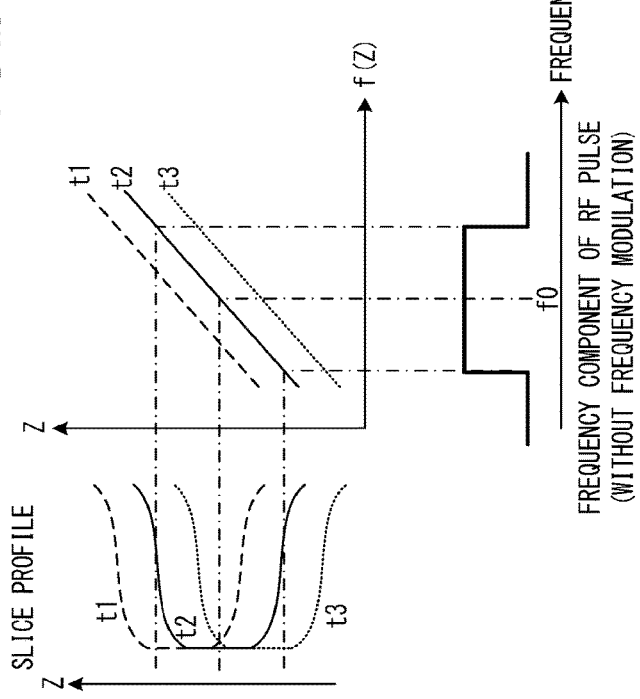
FIG. 4A
FIG. 4B
FIG. 4C

MAGNETIC RESONANCE IMAGING APPARATUS

CROSS-REFERENCE TO RELATED APPLICATIONS

This application is based upon and claims the benefit of priority from Japanese Patent Application No. 2015-32996 filed on Feb. 23, 2015, and Japanese Patent Application No. 2016-22782, filed on Feb. 9, 2016, the entire contents of each of which are incorporated herein by reference.

FIELD

Embodiments described herein relate generally to a magnetic resonance imaging apparatus.

BACKGROUND

MRI (Magnetic Resonance Imaging) is an imaging method which magnetically excites nuclear spin of an object (e.g., a patient) placed in a static magnetic field with an RF pulse having the Larmor frequency and reconstructs an image based on MR signals generated due to the excitation. The above-described MRI means magnetic resonance imaging, the RF pulse means a radio frequency pulse, and the MR (Magnetic Resonance) signal means a nuclear magnetic resonance signal.

BRIEF DESCRIPTION OF THE DRAWINGS

In the accompanying drawings:

FIG. 4A to FIG. 4C are schematic diagrams illustrating an example of comparison of slice profiles between a case where frequency modulation of the first embodiment is performed and a case where the frequency modulation of the first embodiment is not performed;

DETAILED DESCRIPTION

Figure 1:
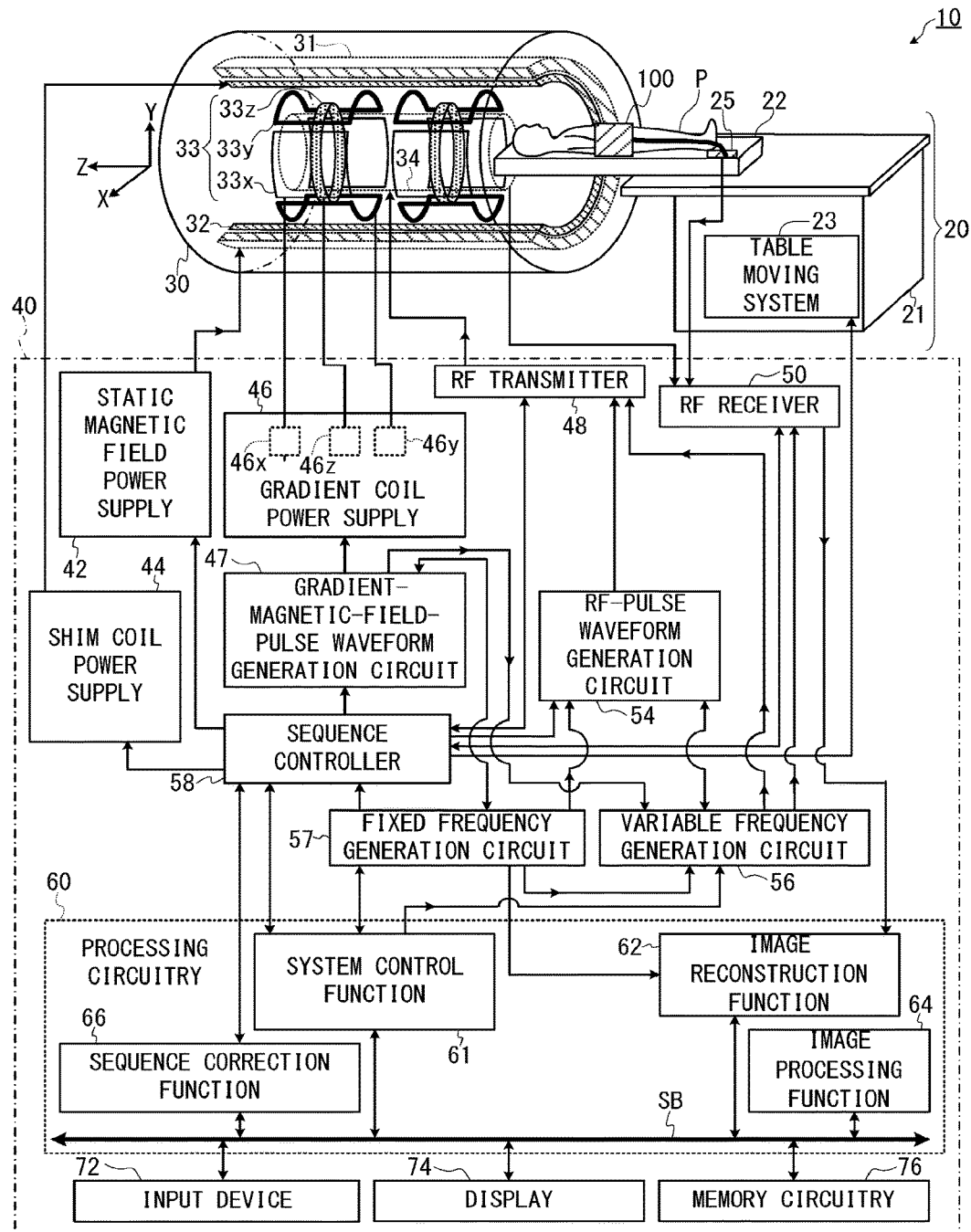
FIG. 1 is a block diagram illustrating an example of overall configuration of an MRI apparatus of the first embodiment.

In one embodiment, an MRI apparatus includes a gradient generation circuit configured to apply a gradient pulse according to a pulse sequence in which application of an RF pulse and application of the gradient pulse are included; and an RF transmission circuit configured to (a) perform modulation on a controlled output waveform of the RF pulse in such a manner that the controlled output waveform of the RF pulse follows time variation of a magnetic resonance frequency caused by time variation of an eddy-current magnetic field estimated from a waveform of the gradient pulse and (b) apply the RF pulse subjected to the modulation to an object.

Distortion of distribution of a gradient magnetic field is known as one of factors of degradation of image quality in MRI. Ideal distribution of a gradient magnetic field in each of the slice selection direction, the phase encode direction, and the frequency encode direction is, for example, such distribution that magnetic field intensity lineally changes according to a position in its application direction. However, an eddy current is actually generated when a pulse electric current is supplied to a gradient coil, and the gradient magnetic field distribution is distorted because a magnetic field generated by the eddy current is superimposed on the gradient magnetic field generated by the gradient coil.

Hereinafter, a magnetic field caused by an eddy current is referred to as an eddy-current magnetic field. An eddy-current magnetic field is a gradient magnetic field component which is mainly attributable to switching of gradient magnetic fields and is generated by electromagnetic induction from metal existing near a gradient coil. Thus, the main factor of an eddy-current magnetic field is a leakage magnetic flux of a gradient coil. When the actual magnetic field deviates from intended magnetic field intensity and intended magnetic field distribution due to the effect of an eddy-current magnetic field, there is a possibility of degradation of image quality.

In addition, an eddy-current magnetic field includes many components from a zero-order component to a high-order component. A first-order component of an eddy-current magnetic field is, for example, a gradient magnetic field component which increases and decreases substantially in proportion to the distance from the magnetic field center. Further, a zero-order component of an eddy-current magnetic field can be interpreted as a gradient magnetic field component which increases and decreases static magnetic field intensity.

Here, the Larmor frequency is in proportion to static magnetic field intensity. Thus, when the Larmor frequency inside an object in an imaging region changes due to a zero-order component of an eddy-current magnetic field, a relative frequency of an RF pulse with reference to the Larmor frequency changes (i.e., difference between a frequency of an RF pulse and the actual Larmor frequency as a reference frequency changes).

For example, when static magnetic field intensity increases from 1.5 Tesla to 1.50001 Tesla due to a zero-order component of an eddy-current magnetic field, the Larmor frequency inside an object increases by the amount in proportion to the increment 0.00001 Tesla. In this case, in the following embodiments, a phase of an RF pulse electric current supplied to an RF transmission coil is advanced so that a frequency of an RF pulse increases by the amount corresponding to the increment of the Larmor frequency.

In other words, in the following embodiments, frequency modulation is performed on a controlled output waveform of each RF pulse so that a frequency of each RF pulse follows slight change in the Larmor frequency estimated from a zero-order component of an eddy-current magnetic field. Thereby, an MRI apparatus brings the center frequency of each RF pulse applied to an imaging region close to the actual Larmor frequency inside an object in the imaging region, which reflects a zero-order component of an eddy-current magnetic field, as much as possible.

In the following description, it is assumed that frequency modulation is basically the same as phase modulation. This is because to perform phase modulation to advance a phase by 360° per one second is equivalent to performing frequency modulation to increase a frequency by 1 Hz.

Hereinafter, MRI apparatuses and MRI methods according to embodiments of the present invention will be described with reference to the accompanying drawings. Note that the same reference numbers are given for identical components in each figure, and duplicate description is omitted.

First Embodiment

FIG. 1 is a functional block diagram illustrating an example of overall configuration of the MRI apparatus 10 of the first embodiment. Note that the functional block diagram shown in FIG. 1 is common to the second to fourth embodiments except that the sequence correction function 66 shown in FIG. 1 is omitted in the second to fourth embodiments.

As an example here, the components of the MRI apparatus 10 will be described by sorting them into three groups: a bed 20, a gantry 30, and a control device 40.

Firstly, the bed 20 includes a supporting platform 21, a table 22, and a table moving system 23 disposed inside the supporting platform 21. An object P is placed on the top surface of the table 22. Further, plural connection ports 25 are arranged on the top surface of the table 22, and an RF coil 100 to be mounted on the object P is connected to one of the connection ports 25.

The supporting platform 21 supports the table 22 in such a manner that the table 22 can move in the horizontal direction (i.e., the Z-axis direction in the apparatus coordinate system). The table moving system 23 adjusts the position of the table 22 in the vertical direction by adjusting the height of the supporting platform 21, when the table 22 is located outside the gantry 30. In addition, the table moving system 23 inserts the table 22 into inside of the gantry 30 by moving the table 22 in the horizontal direction and moves the table 22 to outside of the gantry 30 after completion of imaging.

Secondly, the gantry 30 is shaped, for example, in the form of a cylinder and is installed in an imaging room. The gantry 30 includes a static magnetic field magnet 31, a shim coil 32, a gradient coil 33, and an RF coil 34.

The static magnetic field magnet 31 is, for example, a superconductivity coil and shaped in the form of a cylinder. The static magnetic field magnet 31 forms a static magnetic field in an imaging space by using electric currents supplied from a static magnetic field power supply 42 of the control device 40 described below. The above-described imaging space means, for example, a space in the gantry 30 in which the object P is placed and to which the static magnetic field is applied. Note that the static magnetic field power supply 42 may be omitted by configuring the static magnetic field magnet 31 as a permanent magnet.

The shim coil 32 is, for example, shaped in the form of a cylinder and arranged inside the static magnetic field magnet 31 so as to become coaxial with the static magnetic field magnet 31. The shim coil 32 forms an offset magnetic field which uniforms the static magnetic field by using electric currents supplied from a shim coil power supply 44 of the control device 40 described below.

The gradient coil 33 is, for example, shaped in the form of a cylinder and arranged inside the shim coil 32. The gradient coil 33 includes an X-axis gradient coil 33x, a Y-axis gradient coil 33y, and a Z-axis gradient coil 33z.

In the present specification, the X-axis, the Y-axis, and the Z-axis are assumed to be those of the apparatus coordinate system unless otherwise specifically noted. As an example here, the X-axis, Y-axis, and Z-axis of the apparatus coordinate system are defined as follows.

First, the Y-axis direction is defined as the vertical direction, and the table 22 is arranged in such a position that the direction of the normal line of its top surface becomes equal to the Y-axis direction. The horizontal moving direction of the table 22 is defined as the Z-axis direction, and the gantry 30 is installed in such a manner that its axis direction becomes equal to the Z-axis direction. The X-axis direction is the direction perpendicular to these Y-axis direction and Z-axis direction, and is the width direction of the table 22 in the example of FIG. 1.

The X-axis gradient coil 33x forms a gradient magnetic field Gx in the X-axis direction in an imaging region according to an electric current supplied from an X-axis gradient coil power supply 46x described below. Similarly, the Y-axis gradient coil 33y forms a gradient magnetic field Gy in the Y-axis direction in an imaging region according to an electric current supplied from a Y-axis gradient coil power supply 46y described below. Similarly, the Z-axis gradient coil 33z forms a gradient magnetic field Gz in the Z-axis direction in an imaging region according to an electric current supplied from a Z-axis gradient coil power supply 46z described below.

Meanwhile, directions of a gradient magnetic field Gss in the slice selection direction, a gradient magnetic field Gpe in the phase encoding direction, and a gradient magnetic field Gro in the readout (i.e., frequency encoding) direction can be arbitrarily selected as logical axes, by combining the gradient magnetic fields Gx, Gy and Gz in the X-axis, Y-axis, and Z-axis directions as three physical axes of the apparatus coordinate system.

The above-described imaging region means, for example, at least a part of an acquisition range of MR signals used to generate one image or one set of images, which becomes an image. For example, when MR signals are acquired in a range wider than a region made into an image in order to prevent aliasing, the imaging region is a part of the acquisition range of MR signals. On the other hand, in some cases, the entire acquisition range of MR signals becomes an image, i.e., the imaging region matches the acquisition range of MR signals. The above-described one set of images means, for example, plural images when MR signals of the plural images are acquired collectively in one pulse sequence such as multi-slice imaging.

The RF coil 34 is, for example, shaped in the form of a cylinder and arranged inside the gradient coil 33. As an example here, the RF coil 34 includes a non-illustrated whole body QD (quadrature) coil equipped with both functions of applying RF pulses and receiving MR signals. A QD coil is an RF coil of quadrature-phase type.

Thirdly, the control device 40 includes the static magnetic field power supply 42, the shim coli power supply 44, the gradient coil power supply 46, a gradient-magnetic-field-pulse waveform generation circuit 47, an RF transmitter 48, an RF receiver 50, an RF-pulse waveform generation circuit 54, a variable frequency generation circuit 56, a fixed frequency generation circuit 57, a sequence controller 58, processing circuitry 60, an input device 72, a display 74, and memory circuitry 76.

The gradient-magnetic-field-pulse waveform generation circuit 47 generates a waveform signal for an X-axis gradient magnetic field pulse, a waveform signal for a Y-axis gradient magnetic field pulse, and a waveform signal for a Z-axis gradient magnetic field pulse based on the gradient magnetic field pulse waveforms of respective axes inputted from the sequence controller 58. The gradient-magnetic-field-pulse waveform generation circuit 47 outputs these waveform signals of the respective axes to the gradient coil power supply 46.

The gradient coil power supply 46 includes the X-axis gradient coil power supply 46x, the Y-axis gradient coil power supply 46y, and the Z-axis gradient coil power supply 46z.

The X-axis gradient coil power supply 46x supplies the X-axis gradient coil 33x with an electric current for forming the gradient magnetic field Gx, based on the waveform signal for each X-axis gradient magnetic field pulse inputted from the gradient-magnetic-field-pulse waveform generation circuit 47. Similarly, the Y-axis gradient coil power supply 46y supplies the Y-axis gradient coil 33y with an electric current for forming the gradient magnetic field Gy, based on the waveform signal for each Y-axis gradient magnetic field pulse inputted from the gradient-magnetic-field-pulse waveform generation circuit 47. Similarly, the Z-axis gradient coil power supply 46z supplies the Z-axis gradient coil 33z with an electric current for forming the gradient magnetic field Gz, based on the waveform signal for each Z-axis gradient magnetic field pulse inputted from the gradient-magnetic-field-pulse waveform generation circuit 47.

The fixed frequency generation circuit 57 acquires the center frequency value of each RF pulse calculated by a prescan to be described below from the sequence controller 58. The fixed frequency generation circuit 57 includes components for generating an intended frequency such as a crystal controlled oscillator with high degree of stability. The fixed frequency generation circuit 57 generates a carrier frequency signal having the acquired center frequency value by using the above-described crystal controlled oscillator, and outputs the generated carrier frequency signal to the RF-pulse waveform generation circuit 54.

The computation circuit of the RF-pulse waveform generation circuit 54 is, for example, formed on a semiconductor substrate, and a non-illustrated oscillator for generating a clock signal (hereinafter, referred to as a substrate clock signal) is also formed on this semiconductor substrate. The RF-pulse waveform generation circuit 54 generates a digital pulse waveform signal according to the substrate clock signal.

Further, the RF-pulse waveform generation circuit 54 generates an analogue pulse waveform signal by performing D/A (Digital to Analogue) conversion on the digital pulse waveform signal. As to generation of this analogue pulse waveform signal, the RF-pulse waveform generation circuit 54 compresses or decompress the analogue pulse waveform signal in such a manner that the analogue pulse waveform signal matches a rectangular bandwidth by a controlled output waveform of each RF pulse in a pulse sequence inputted from the sequence controller 58.

Afterward, the RF-pulse waveform generation circuit 54 modulates the carrier frequency signal inputted from the fixed frequency generation circuit 57 with the above-described analogue pulse waveform signal to, and outputs the modulated pulse waveform signal to the RF transmitter 48.

The variable frequency generation circuit 56 includes a non-illustrated phase locked loop, a direct digital synthesizer, and a mixer, for example. The variable frequency generation circuit 56 acquires the above-described modulated pulse waveform signal from the RF-pulse waveform generation circuit 54, then performs frequency modulation of $\Delta f$ on the acquired modulated pulse waveform signal, and then outputs the pulse waveform signal subjected to the frequency modulation to the RF transmitter 48.

Note that, however, in the first embodiment, the processing circuitry 60 performs frequency modulation of $\Delta f$ on a controlled output waveform of each RF pulse in the processing so that a frequency of each RF pulse follows change in the Larmor frequency estimated from a zero-order component of an eddy-current magnetic field. After that, a pulse sequence subjected to this frequency modulation is inputted to the sequence controller 58 in the first embodiment. That is, in the first embodiment, it is not the variable frequency generation circuit 56 but the processing circuitry 60 that performs the above-described frequency modulation of $\Delta f$.

The RF transmitter 48 generates an RF pulse electric current of the Larmor frequency for causing nuclear magnetic resonance based on the modulated pulse waveform signal inputted from the RF-pulse waveform generation circuit 54 (note that, in the third embodiment in which frequency modulation of $\Delta f$ is performed by the variable frequency generation circuit 56 as described below, the RF transmitter 48 generates the above-described RF pulse electric current based on a pulse waveform signal subjected to frequency modulation inputted from the variable frequency generation circuit 56). The RF transmitter 48 transmits the generated RF pulse electric current to the RF coil 34. An RF pulse in accordance with this RF pulse electric current is applied to the object P by the RF coil 34.

The whole-body QD coil of the RF coil 34 and the RF coil 100 to be mounted on the object P receive MR signals emitted from nuclear spin inside the object P excited by the RF pulse, and the received MR signals are inputted to the RF receiver 50.

The RF receiver 50 generates raw data which are digitized complex number data of MR signals obtained by performing predetermined signal processing on the received MR signals and then performing A/D (Analog to Digital) conversion on the MR signals. The RF receiver 50 outputs the generated raw data of MR signals to an image reconstruction function 62 of the processing circuitry 60.

The sequence controller 58 stores control information needed in order to drive the gradient coil power supply 46, the RF transmitter 48, and the RF receiver 50 according to commands inputted from the processing circuitry 60. The above-described control information includes, for example, sequence information describing operation control information such as intensity, an application period, and an application timing of the pulse electric currents which should be applied to the gradient coil power supply 46.

The sequence controller 58 generates the gradient magnetic fields Gx, Gy and Gz and RF pulses by driving the gradient coil power supply 46, the RF transmitter 48, and the RF receiver 50 according to a predetermined sequence stored therein. The sequence controller 58 may be configured as special-purpose hardware. Additionally or alternatively, the sequence controller 58 may include a processor which implements each of the above-described functions by software processing.

The processing circuitry 60 may also be configured as special-purpose hardware or include a processor which implements various types of functions by software processing. Hereinafter, an example in which the processing circuitry 60 implements various types of functions by software processing of the processor will be described.

Specifically, as shown in FIG. 1, the processing circuitry 60 implements a system control function 61, an image reconstruction function 62, an image processing function 64, and a sequence correction function 66 by executing programs stored in the memory circuitry 76 or programs directly stored in the processor of the processing circuitry 60.

The above-described term "processor" means, for instance, a circuit such as a CPU (Central Processing Unit), a GPU (Graphics Processing Unit), an ASIC (Application Specific Integrated Circuit), a programmable logic device including an SPLD (Simple Programmable Logic Device) and a CPLD (Complex Programmable Logic Device) as examples, and an FPGA (Field Programmable Gate Array).

The number of processors included in the processing circuitry 60 may be one, two, or more. Similarly, the number of processors included in the sequence controller 58 may be one, two, or more.

The system control function 61 of the processing circuitry 60 implements system control of the entirety of the MRI apparatus 10 in setting of imaging conditions of a main scan, an imaging operation, and image display after imaging.

The above-described imaging conditions refer to under what condition RF pulses and the like are applied in what type of pulse sequence, and under what condition MR signals are acquired from the object P, for example. As parameters of the imaging conditions, for example, an imaging region as positional information in the imaging space, a flip angle, a repetition time TR, number of slices, an imaging part, and type of pulse sequence such as spin echo and parallel imaging are included. The above-described imaging part means an anatomical portion of the object P to be imaged, such as the head, the chest, and the abdomen.

The above-described main scan is a scan for imaging an intended diagnosis image such as a T1 weighted image, and it does not include a scan for acquiring MR signals for a scout image or a tuning scan. A scan is an operation of acquiring MR signals, and it does not include image reconstruction processing.

The above-described tuning scan is, for example, a scan for determining unconfirmed elements of imaging conditions of a main scan, conditions and data used for image reconstruction processing and correction processing after the image reconstruction, and the tuning scan is performed separately from the main scan. As an example of a tuning scan, there is a sequence of calculating the center frequency of the RF pulses used in the main scan. A prescan is a tuning scan which is performed before the main scan.

In addition, the system control function 61 causes the display 74 to display screen information for setting imaging conditions. Then, the system control function 61 sets the imaging conditions based on command information inputted from the input device 72, and sets a pulse sequence based on these imaging conditions.

The sequence correction function 66 corrects a pulse sequence provisionally set by the system control function 61, and outputs the corrected pulse sequence to the sequence controller 58. The above-described correction is performed in such a manner that a zero-order component of an eddy-current magnetic field is calculated and a controlled output waveform of each RF pulse is corrected so as to follow change in the Larmor frequency caused by the zero-order component of an eddy-current magnetic field. Details of this correction will be described below.

The input device 72 includes input tools such as a mouse and a keyboard and provides a user with a function to set imaging conditions and image processing conditions.

The image reconstruction function 62 arranges and stores the raw data of MR signals inputted from the RF receiver 50 as k-space data, according to the phase encode step number and the frequency encode step number. The above-described k-space means a frequency space. The image reconstruction function 62 generates image data of the object P by performing image reconstruction processing including Fourier transform on the k-space data. The image reconstruction function 62 stores the image data immediately after the image reconstruction processing, in the memory circuitry 76.

The image processing function 64 acquires the image data immediately after the image reconstruction processing, performs predetermined image processing on the acquired image data, and stores the image data being subjected to the image processing in the memory circuitry 76 as display image data.

The memory circuitry 76 stores the display image data after adding accompanying information such as the imaging conditions used for generating the display image data and information of the object P (i.e., patient information) to the display image data.

Incidentally, the four components including the processing circuitry 60, the input device 72, the display 74, and the memory circuitry 76 may be configured as one computer and installed in a control room, for example.

Although the components of the MRI apparatus 10 are sorted into three groups including the gantry 30, the bed 20 and the control device 40 in the above description, this is only an example of interpretation. For example, the table moving system 23 may be interpreted as a part of the control device 40.

Additionally, the RF receiver 50 may be configured not as a component of the control device 40 disposed outside the gantry 30 but as a component of the gantry 30 disposed inside the gantry 30. In this case, for example, an electronic circuit board equivalent to the RF receiver 50 may be disposed in the gantry 30. Then, the MR signals which are analog electrical signals converted from the electromagnetic waves by the RF coil 34 and/or the RF coil 100 may be amplified by a pre-amplifier in the electronic circuit board, then the amplified signals may be outputted to the outside of the gantry 30 as digital signals and inputted to the image reconstruction unit 62 of the processing circuitry 60. As to output of the signals to the outside of the gantry 30, for example, an optical communication cable is preferably used to transmit the signals in the form of optical digital signals. This is because the effect of external noise is reduced.

Figure 2:
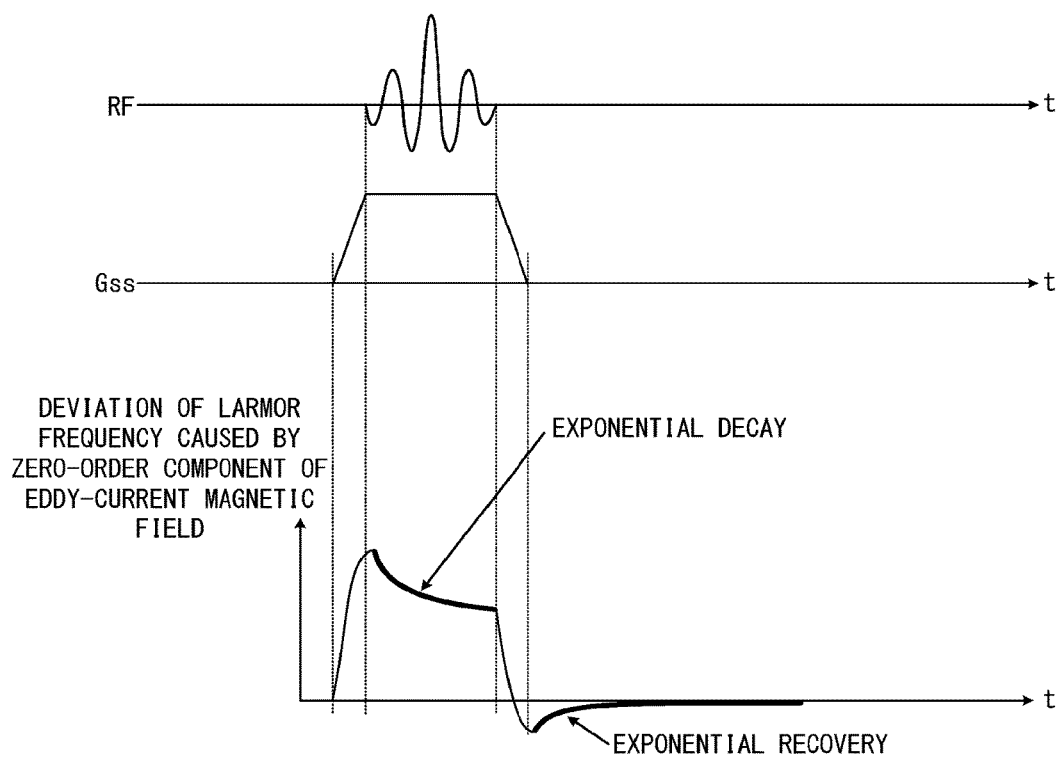
FIG. 2 is a schematic timing chart illustrating an example of deviation of the Larmor frequency due to time variation of intensity of each gradient magnetic field Gss in a slice selection direction and a zero-order component of an eddy-current magnetic field caused by the gradient magnetic field Gss.

FIG. 2 is a schematic timing chart illustrating an example of deviation of the Larmor frequency due to time variation of intensity of each of a gradient magnetic field Gss in a slice selection direction and a zero-order component of an eddy-current magnetic field caused by this gradient magnetic field Gss. The notation "RF" in the top part of FIG. 2 indicates a waveform of an excitation RF pulse as an input signal before being up-converted to a carrier frequency.

In the present embodiment, for example, a waveform signal like the top part of FIG. 2 is up-converted to a carrier frequency of the Larmor frequency band by frequency modulation, and this carrier frequency and/or the waveform is modulated by $\Delta f$, and then outputted as an RF pulse from the RF coil 34. Thus, the top part of FIG. 2 is different from time variation of intensity of an actually outputted RF pulse.

The notation "Gss" in the middle part of FIG. 2 indicates time variation of intensity of the gradient magnetic field Gss in the slice selection direction to be applied at the same time as the excitation RF pulse. The bottom part of FIG. 2 indicates time variation of deviation of the magnetic resonance frequency (i.e., the Larmor frequency) due to time variation of a zero-order component of an eddy-current magnetic field caused by the gradient magnetic field Gss in the slice selection direction. The above-described deviation of the Larmor frequency means deviation of the actual Larmor frequency from the ideal Larmor frequency which is calculated under the premise that any eddy-current magnetic field does not exist. The notation "t" on the right side of the horizontal axis in each of the top part, the middle part, and the bottom part of FIG. 2 indicates elapsed time.

As shown in the middle and bottom parts of FIG. 2, in the period during which intensity of the gradient magnetic field Gss in the slice selection direction increases, intensity of a zero-order component of an eddy-current magnetic field increases and thereby the Larmor frequency becomes higher. Afterward, in the period during which intensity of the gradient magnetic field Gss in the slice selection direction is constant, intensity of a zero-order component of an eddy-current magnetic field exponentially decays according to a time constant and the Larmor frequency becomes lower.

Since intensity of the gradient magnetic field Gss in the slice selection direction begins to decrease before intensity of a zero-order component of an eddy-current magnetic field becomes zero due to exponential decay in the example of FIG. 2, intensity of a zero-order component of an eddy-current magnetic field falls to a minus value in association with the decrease in intensity of the gradient magnetic field Gss and thereby the Larmor frequency shifts to a more negative side than its intended frequency. Afterward, since intensity of the gradient magnetic field Gss in the slice selection direction becomes constant at zero, a zero-order component of an eddy-current magnetic field exponentially recovers according to its time constant and the Larmor frequency gradually returns to its intended frequency.

When the slice selection direction is the Z-axis direction as an example, the sequence correction function 66 stores a time constant $\tau$za and a time constant $\tau$zb. The time constant $\tau$za is a time constant in the case where intensity of a zero-order component of an eddy-current magnetic field exponentially decays from a positive value to zero in a period during which intensity of the Z-axis gradient magnetic field pulse is constant (including zero). Similarly, the time constant $\tau$zb is a time constant in the case where intensity of a zero-order component of an eddy-current magnetic field exponentially recovers from a negative value to zero in a period during which intensity of the Z-axis gradient magnetic field pulse is constant.

These time constants $\tau$za and $\tau$zb may be preliminarily measured and stored in the sequence correction function 66 and the system control function 61 of the processing circuitry 60, during installation and adjustment work of the MRI apparatus 10, for example.

As to a time constant $\tau$ya when intensity of a zero-order component of an eddy-current magnetic field exponentially decays from a positive value to zero in a period during which intensity of the Y-axis gradient magnetic field pulse is constant, it is preliminarily measured and stored in the processing circuitry 60 in a similar manner as described above. As to a time constant $\tau$yb when intensity of a zero-order component of an eddy-current magnetic field exponentially recovers from a negative value to zero in a period during which intensity of the Y-axis gradient magnetic field pulse is constant, it is preliminarily measured and stored in the processing circuitry 60 in a similar manner as described above.

As to a time constant $\tau$xa when intensity of a zero-order component of an eddy-current magnetic field exponentially decays from a positive value to zero in a period during which intensity of the X-axis gradient magnetic field pulse is constant, it is preliminarily measured and stored in the processing circuitry 60 in a similar manner as described above. As to a time constant $\tau$xb when intensity of a zero-order component of an eddy-current magnetic field exponentially recovers from a negative value to zero in a period during which intensity of the X-axis gradient magnetic field pulse is constant, it is preliminarily measured and stored in the processing circuitry 60 in a similar manner as described above.

The sequence correction function 66 calculates intensity of zero-order components of respective eddy-current magnetic fields caused by respective gradient magnetic field pulses based on each of the above-described time constants and time variation of intensity of every gradient magnetic field pulse, as a function of elapsed time t. For this reason, the sequence correction function 66 calculates time variation of intensity (i.e., waveform) of all the gradient magnetic field pulses Gss, Gpe, and Gro in the slice selection direction, the phase encode direction, and the readout direction.

As an example here, a waveform of each gradient magnetic field pulse is calculated based on a command value of (time variation of) an electric current supplied to each of the X-axis gradient coil 33x, the Y-axis gradient coil 33y, and the Z-axis gradient coil 33y, under the assumption that each gradient magnetic field pulse having a waveform in accordance with this command value is generated. When electric power supplied to the gradient coil 33 is defined based on not a command value of an electric current value but a command value of (time variation) of each voltage value, the sequence correction function 66 performs the above-described calculation based on command values of respective voltage values.

Intensity of a zero-order component of an eddy-current magnetic field at a certain time point tx within a pulse sequence can be calculated as an integrated value by accumulating zero-order components of all the eddy-current magnetic fields caused by all the gradient magnetic field pulses applied from the start time to the time point tx of the pulse sequence. Such intensity of zero-order components of respective eddy-current magnetic fields can be calculated by using known technology and its detailed description is omitted.

In order to calculate intensity of a zero-order component of an eddy-current magnetic field at a certain time point tx, it is accurate to reflect all the gradient magnetic field pulses applied from the start time to the time point tx of the pulse sequence in the above-described manner. In this method, however, calculation load becomes large. In the meanwhile, in consideration of decay due to a time constant, a zero-order component of an eddy-current magnetic field caused by a gradient magnetic field pulse applied prior to the immediate predetermined period from the current time point may be negligible.

In other words, in order to sufficiently accurately calculate intensity of a zero-order component of an eddy-current magnetic field at a certain time point tx, in the actual calculation, it is enough to use only the gradient magnetic field pulses applied in the predetermined period PS which ends at the time point tx. This point will be described in detail by reference to the next FIG. 3.

Figure 3:
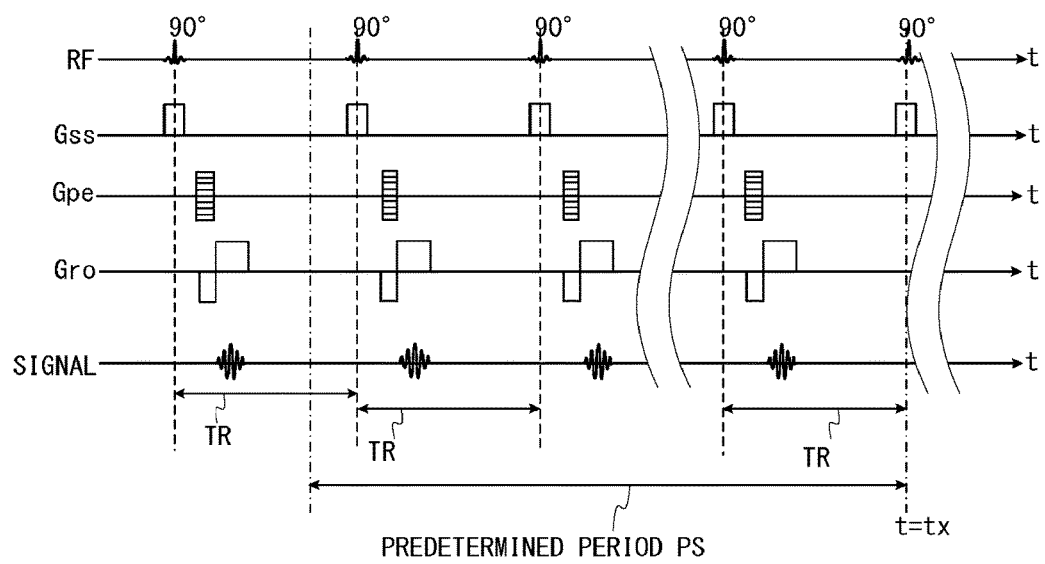
FIG. 3 is a schematic timing chart illustrating an example of a time range of gradient magnetic fields reflected in calculation of intensity of a zero-order component of an eddy-current magnetic field.

FIG. 3 is a schematic timing chart illustrating an example of a time range of gradient magnetic fields reflected in calculation of intensity of a zero-order component of an eddy-current magnetic field. Although a pulse sequence of a field echo type is illustrated in FIG. 3 as an example, technology of the present embodiment is applicable to other pulse sequences such as a spin echo type.

In FIG. 3, each horizontal axis corresponds to elapsed time t, "RF" at the top part indicates an RF pulse, "Gss" at the second top part indicates the gradient magnetic field in the slice selection direction, "Gpe" at the third top part indicates the gradient magnetic field in the phase encode direction, "Gro" at the fourth top part indicates the gradient magnetic field in the readout direction (i.e., frequency encode direction), and "SIGNAL" at the bottom part indicates an MR signal.

As an example here, first, an excitation RF pulse whose flip angle is 90° and the gradient magnetic field Gss in the slice selection direction are concurrently applied at the start of the pulse sequence.

Next, the gradient magnetic field pulse Gpe in the phase encode direction and the gradient magnetic field pulse Gro having negative polarity in the readout direction are applied.

Then, when application of the gradient magnetic field pulse Gpe in the phase encode direction is completed, the polarity of the gradient magnetic field pulse Gro in the readout direction is reversed. In a period during which the gradient magnetic field pulse Gro with the reversed polarity is applied in the readout direction, an MR signal is detected.

The foregoing is acquisition processing of an MR signal of one phase encode step. Then, after elapse of repetition time TR from the start timing of applying the excitation RF pulse, similar processing is repeated Npe times, where Npe is the total number of the phase encode steps. Thereby, MR signals required for reconstructing one image are acquired.

Here, focus on the time point tx in the pulse-duration of the excitation RF pulse on the right side of FIG. 3. The sequence correction function 66 performs frequency modulation by calculating intensity of the zero-order component of the eddy-current magnetic field at the time point tx in the pulse-duration of this excitation RF pulse as follows.

First, the sequence correction function 66 defines the predetermined period PS based on the conditions of pulse sequence including respective time constants of a zero-order component of an eddy-current magnetic field in such a manner that a zero-order component of an eddy-current magnetic field can be calculated with sufficient accuracy. For example, as shown in FIG. 3, the predetermined period PS is defined as a period which is more than three times longer than the length of the repetition time TR.

Next, the sequence correction function 66 selects all the gradient magnetic field pulses applied in the predetermined period PS which ends at the time point tx, based on the conditions of the pulse sequence.

Then, the sequence correction function 66 acquires command values (of time variation) of respective electric current values or respective voltage values supplied to the X-axis gradient coil 33$x$, the Y-axis gradient coil 33$y$, and the Z-axis gradient coil 33$y$ for generating the selected gradient magnetic field pulses, from the conditions of the pulse sequence.

And then, the sequence correction function 66 calculates time variation (i.e., waveform) of intensity of each of the selected gradient magnetic field pulses, based on the acquired command values of electric current values or voltage values.

After that, the sequence correction function 66 calculates zero-order components of respective eddy-current magnetic fields caused by all the gradient magnetic field pulses applied in the predetermined period PS as a function of elapsed time t. This calculation is performed based on time variation of intensity of each of the gradient magnetic field pulses applied in the predetermined period PS calculated in the above-described manner. Further, the sequence correction function 66 integrates those zero-order components of respective eddy-current magnetic fields, as a function of elapsed time t. This integrated function is time variation of zero-order components of respective eddy-current magnetic fields within the pulse-duration of the excitation RF pulse in which the time point tx is included. The sequence correction function 66 calculates time variation of zero-order components of respective eddy-current magnetic fields for each of the remaining RF pulses of the pulse sequence.

Further after that, the sequence correction function 66 calculates the actual Larmor frequency inside the object P within the pulse-duration of each RF pulse. Specifically, the actual Larmor frequency is calculated based on magnetic field intensity generated by the static magnetic field magnet 31 and time variation of zero-order components of respective eddy-current magnetic fields calculated for each RF pulse in the above-described manner. The above calculation of the actual Larmor frequency is performed for all the RF pulses included in the pulse sequence.

Finally, the sequence correction function 66 corrects a controlled output waveform of every RF pulse included in the pulse sequence by performing frequency modulation on the controlled output waveform of every RF pulse, in such a manner that the corrected controlled output waveform follows (i.e., tracks) the actual Larmor frequency within the pulse-duration of each RF pulse calculated in the above-described manner. The above-described "to follow" means to perform frequency modulation in such a manner that the frequency within the pulse-duration of each outputted RF pulse matches the actual Larmor frequency.

Frequency modulation will be explained more specifically below, taking an example of an RF transmission coil of quadrature phase type like the whole-body QD coil of the RF coil 34. In the QD coil, an electric current is supplied to each of the first axis side and the second axis side of a rotating coordinate system, and thereby an RF pulse is transmitted from the QD coil. Note that the first axis and the second axis are perpendicular to each other and the phase of the electric current supplied to the first axis side is different from the phase of the electric current supplied to the second axis side by 90°. In the case of an RF transmission coil of quadrature phase type, a real part component and an imaginary part component of an RF pulse respectively correspond to the first electric current component supplied to the first axis side and the second electric current component supplied to the second axis side. The phase and amplitude of an RF pulse can be calculated from those real part component and imaginary part component. This calculation method is known and its detailed description is omitted.

When the actual Larmor frequency reflecting a zero-order components of each eddy-current magnetic field is lower than the center frequency of the controlled output waveform of the RF pulse defined in the pulse sequence, for example, frequency modulation is performed on the controlled output waveform of the RF pulse electric current so that the phase of the RF signal within the pulse-duration of this RF pulse is lagged. The RF pulse electric current subjected to this frequency modulation is supplied to each of the first axis side and the second axis side of an RF transmission coil of quadrature phase type via a phase divider, for example. Thus, the phase of the RF pulse electric current supplied to the first axis side is different from the phase of the RF pulse electric current supplied to the second axis side by 90°.

As a result, the output frequency within the pulse-duration of an RF pulse emitted from the RF transmission coil as an electromagnetic wave substantially matches the actual Larmor frequency inside an object which changes due to time variation of zero-order components of respective eddy-current magnetic fields. In this manner, the sequence correction function 66 corrects a pulse sequence.

FIGS. 4A to 4C are schematic diagrams illustrating an example of comparison of slice profiles between a case where frequency modulation of the first embodiment is performed and a case where the frequency modulation of the first embodiment is not performed.

Among FIGS. 4A to 4C, FIG. 4B illustrates an example of a slice profile of conventional technology in which frequency modulation of an RF pulse is not performed. On the other hand, FIG. 4C illustrates an example of a slice profile of the first embodiment in which the above-described frequency modulation of an RF pulse is performed.

A slice profile means, for example, a diagram in which intensity of an MR signal generated from a region spatially selected by a gradient magnetic field in response to application of an RF pulse is one-dimensionally illustrated. As an example here, each of FIG. 4B and FIG. 4C illustrates a slice profile in the Z-axis direction. The lower part of FIG. 4B indicates a frequency component of an RF pulse when frequency modulation is not performed, while the lower part of FIG. 4C indicates a frequency component of an RF pulse when frequency modulation is performed.

In both cases where frequency modulation is performed and not performed, it is assumed that the shape of a frequency component of an RF pulse is a rectangular, which corresponds to a shape obtained by performing Fourier transform on an RF pulse envelop shape of a sinc function. In FIG. 4B, it is indicated that the center frequency f0 of each RF pulse is fixed because frequency modulation is not performed. By contrast, in FIG. 4C, it is indicated that the center frequency of each RF pulse temporally changes because frequency modulation is performed.

In each of FIG. 4B and FIG. 4C, a slice profile in the Z-axis direction can be indicated by the following formula (1) which defines the Larmor frequency f(z) at a position Z.

$$f(Z) = f0 + (\gamma/2\pi)*Gz*Z \qquad \text{Formula (1)}$$

In the formula (1), f0 is the intended Larmor frequency under the premise that any eddy-current magnetic field does not exist. γ is a constant referred to as a gyromagnetic ratio, and Gz is intensity of the gradient magnetic field in the Z-axis direction. Since an RF pulse has a certain bandwidth, the slice profile has thickness determined by this bandwidth and the gradient magnetic field Gz.

When a zero-order component of an eddy-current magnetic field exists and this zero-order component temporally changes, the actual Larmor frequency fluctuates (i.e., deviates) from the intended Larmor frequency not only at an application start timing of each RF pulse but also within the pulse-duration of the RF pulse as shown in FIG. 4A. When the deviation of the actual Larmor frequency from the intended Larmor frequency is defined as Δf(t), the formula (2) can be led from the formula (1) in consideration of this deviation Δf(t).

$$f(Z) = f0 + \Delta f(t) + (\gamma/2\pi)*Gz*Z \qquad \text{Formula (2)}$$

The middle part of each of FIG. 4B and FIG. 4C illustrates a graph corresponding to the formula (2). When the deviation Δf(t) changes at the time points t1, t2, and t3 within the pulse-duration of an RF pulse (See also FIG. 4A), the position of the graph shifts in the Z-axis direction according to the deviation Δf(t).

Thus, in conventional technology in which frequency modulation is not performed, the center position of the slice profile shifts at the time points t1, t2, and t3 within the pulse-duration of an RF pulse as shown in FIG. 4B. Accordingly, equivalent thickness of the slice profile becomes larger than the intended thickness.

By contrast, when the frequency modulation of the present embodiment is performed, a controlled output waveform of each RF pulse is corrected so as to follow the deviation of the Larmor frequency caused by zero-order components of respective eddy-current magnetic fields, and thereby the center frequency of each of outputted RF pulses substantially matches the actual Larmor frequency. In this case, the slice profile keeps the same thickness as the intended thickness as shown in FIG. 4C.

Figure 5:
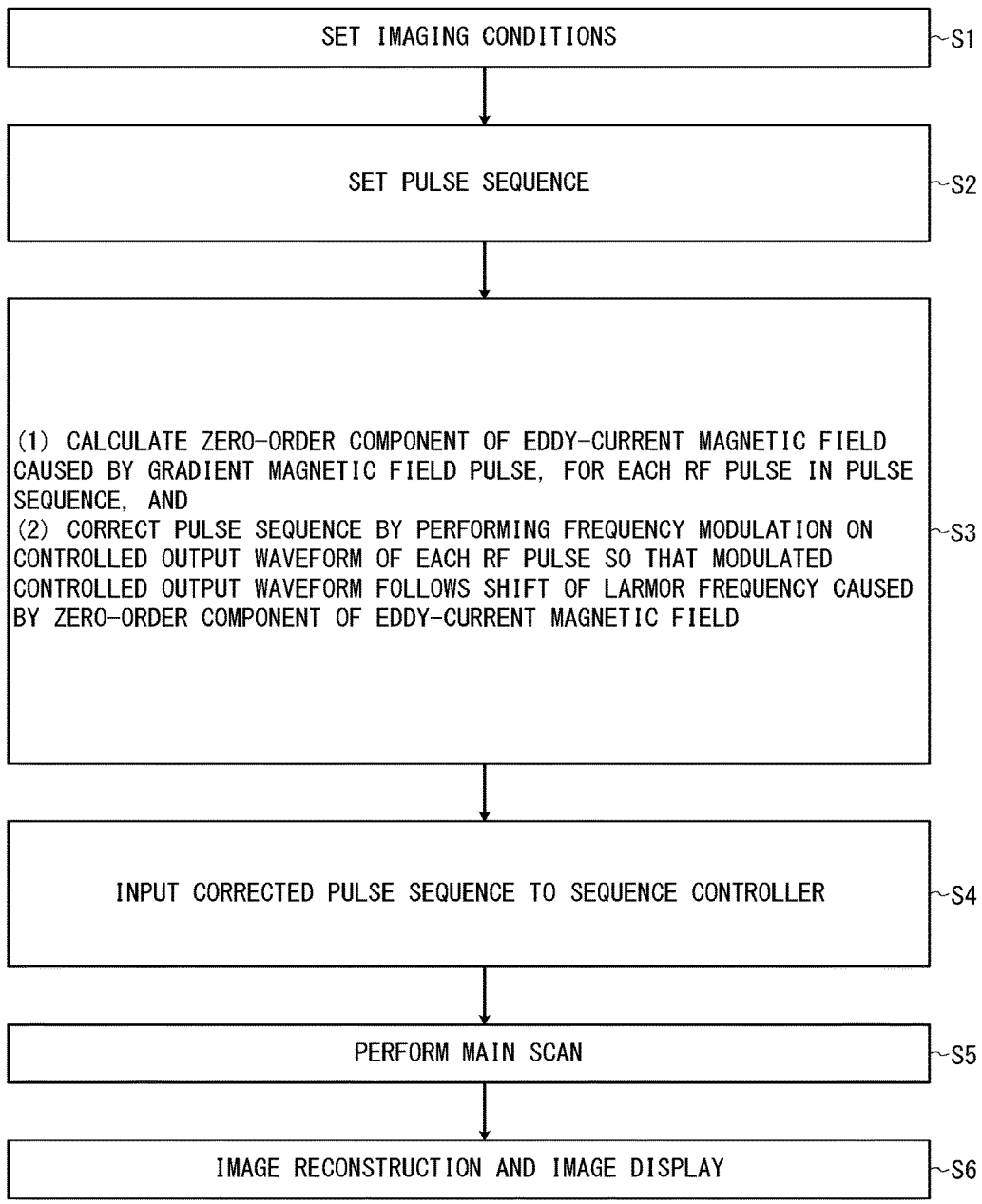
FIG. 5 is a flowchart illustrating an example of a flow of an operation performed by the MRI apparatus of the first embodiment.

FIG. 5 is a flowchart illustrating an example of a flow of an operation performed by the MRI apparatus 10 of the first embodiment. Hereinafter, according to the step numbers in the flowchart of FIG. 5, the operation performed by the MRI apparatus 10 will be described by reference to the above-mentioned FIG. 1 to FIG. 4 as required.

[Step S1] The system control function 61 (FIG. 1) sets imaging conditions based on some imaging conditions inputted to the MRI apparatus 10 via the input device 72. In addition, the center frequency values of respective RF pulses are calculated by a known prescan, and the center frequency values of respective RF pulses are inputted from the sequence controller 58 to the fixed frequency generation circuit 57.

Afterward, the processing proceeds to the Step S2.

[Step S2] On the basis of the imaging conditions set in the step S1, the system control function 61 provisionally sets a pulse sequence. The set pulse sequence includes controlled output waveforms and application timings of respective RF pulses, and controlled output waveforms and application timings of respective gradient magnetic field pulses.

Afterward, the processing proceeds to the Step S3.

[Step S3] The sequence correction function 66 acquires all the conditions of the pulse sequence provisionally set in the step S2 from the system control function 61. The sequence correction function 66 determines the predetermined period PS based on the acquired conditions of the pulse sequence so that zero-order components of respective eddy-current magnetic fields can be calculated with sufficient accuracy as described above (see FIG. 3).

Next, the sequence correction function 66 calculates intensity of a zero-order component of each eddy-current magnetic field which temporally changes at each application timing of the RF pulse and within the pulse-duration thereof. This calculation of intensity of a zero-order component of each eddy-current magnetic field is performed for each of the RF pulses included in the pulse sequence, in the above-described manner. Moreover, the sequence correction function 66 calculates the Larmor frequency at each application timing of the RF pulse and within the pulse-duration thereof, for each RF pulse based on the calculated intensity of each zero-order component.

Next, the sequence correction function 66 corrects a controlled output waveform of each RF pulse by performing frequency modulation on the controlled output waveform, in such a manner that the corrected controlled output waveform follows time variation of the Larmor frequency at each application timing of the RF pulse and within the pulse-duration thereof. In this manner, the sequence correction function 66 corrects the pulse sequence provisionally set in the step S2.

Afterward, the processing proceeds to the Step S4.

[Step S4] The sequence correction function 66 outputs the pulse sequence corrected in the step S3 to the sequence controller 58.

Afterward, the processing proceeds to the Step S5.

[Step S5] The sequence controller 58 controls each component of the MRI apparatus 10 according to the pulse sequence inputted in the step S4 so that data acquisition of the main scan is performed.

Specifically, after the object P is placed on the table 22, the shim coil power supply 44 supplies the shim coil 32 with electric currents. Thereby, the static magnetic field formed in the imaging space is uniformed.

Then, when a command to start imaging is inputted from the input device 72 into the system control function 61 of the processing circuitry 60, the sequence controller 58 drives the gradient-magnetic-field-pulse waveform generation circuit 47, the gradient coil power supply 46, the RF transmitter 48, the RF receiver 50, the RF-pulse waveform generation circuit 54, and the variable frequency generation circuit 56. Thereby, the sequence controller 58 causes the gradient coil 33 to apply each gradient magnetic field pulse to the imaging region in which the imaging part of the object P is included, and causes the RF coil 34 (i.e., the whole-body QD coil) to apply each RF pulse to the imaging region.

As to RF pulses, more detailed explanation is described as follows. The RF-pulse waveform generation circuit 54 generates each digital pulse waveform signal based on the substrate clock signal and generates each analogue pulse waveform signal by performing D/A conversion on each digital pulse waveform signal, as described above. In this processing, the RF-pulse waveform generation circuit 54 compresses or decompresses each analogue pulse waveform signal so that bandwidth of each analogue pulse waveform signal matches a rectangular bandwidth shape determined by a controlled output waveform of each RF pulse in the pulse sequence inputted from the sequence controller 58. The RF-pulse waveform generation circuit 54 modulates the carrier frequency inputted from the fixed frequency generation circuit 57 with the analogue pulse waveform signal, and outputs the modulated pulse waveform signal to the RF transmitter 48.

Note that, each pulse waveform signal, which is input from the sequence controller 58 to the RF-pulse waveform generation circuit 54, has been already corrected so as to follow (i.e., match) the actual Larmor frequency inside the object P, reflecting zero-order components of respective eddy-current magnetic fields in the step S3. Thus, each of the modulated pulse waveform signals inputted to the RF transmitter 48 has been already corrected so as to follow the actual Larmor frequency.

The RF transmitter 48 generates each RF pulse electric current based on each of the inputted pulse waveform signals, and sends each RF pulse electric current to the whole-body QD coil. Then, RF pulse in accordance with this RF pulse electric current is applied to the object P from the whole-body QD coil.

After that, MR signals, which are emitted from the object P in response to the application of the RF pulse, are received by the RF coil 100 (and the whole-body QD coil), and the received MR signals are sent to the RF receiver 50. The RF receiver 50 performs the above-described signal processing on the inputted MR signals so as to generate the raw data of MR signals, and outputs these raw data to the image reconstruction function 62 of the processing circuitry 60. The image reconstruction function 62 arranges and stores the raw data of MR signals as k-space data.

Afterward, the processing proceeds to the Step S6.

[Step S6] The image reconstruction function 62 reconstructs image data by performing image reconstruction processing including Fourier transform on the k-space data generated by the above-described main scan, and stores the reconstructed image data in the memory circuitry 76. The image processing function 64 obtains the reconstructed image data from the memory circuitry 76, performs predetermined image processing on the obtained image data so as to generate two-dimensional display image data, and stores the display image data in the memory circuitry 76. Afterward, the system control function 61 causes the display 74 to display images indicated by the display image data.

The foregoing is the description of the operation of the MRI apparatus 10 of the first embodiment.

Hereinafter, difference between the first embodiment and conventional technology will be described. In conventional technology, change in the actual Larmor frequency caused by a zero-order component of an eddy-current magnetic field is not taken into account in application of each RF pulse. Thus, in conventional technology, shape of a slice profile may degrade. That is, width of a slice profile may become wider than an intended width, as shown in FIG. 4B. In addition, when a narrowband and frequency-selective RF pulse such as a fat suppression RF pulse is applied, there is the following problem in conventional technology. That is, the Larmor frequency of fat tissues shifts, and thereby MR signals from fat tissues are not suppressed but MR signals from water protons which should not be suppressed are suppressed.

On the other hand, in the first embodiment, the sequence correction function 66 calculates zero-order components of respective eddy-current magnetic fields, and calculates the actual Larmor frequency at each application timing of the RF pulse and within the pulse-duration thereof based on the calculated zero-order components of respective eddy-current magnetic fields. Then, the sequence correction function 66 performs frequency modulation on a controlled output waveform of each RF pulse so that the modulated controlled output waveform follows the actual Larmor frequency at each application timing of the RF pulse and within the pulse-duration thereof.

Thus, a pulse sequence corrected in the above-described manner is inputted to the hardware side (i.e., the sequence controller 58) of the control device 40 before the main scan. Accordingly, the frequency of each of actually outputted RF pulses follows the actual Larmor frequency changed by time variation of eddy-current magnetic fields, and thus an intended slice profile can be obtained. As a result, in the present embodiment, precise local excitation in accordance with imaging conditions can be achieved. In particular, in the case of an RF pulse having long pulse-width, effects of the first embodiment are remarkably obtained.

Further, although the Larmor frequency of fat tissues and the Larmor frequency of water protons temporally changes due to each eddy-current magnetic field, the frequency of the RF pulse for the fat or water temporally follows the actual Larmor frequency even within the pulse-duration of each RF pulse. Thus, unnecessary MR signals such as MR signals from fat tissues are more reliably suppressed, and image quality is improved.

Moreover, as to intensity of a zero-order component of each eddy-current magnetic field calculated for each RF pulse in the first embodiment, only the gradient magnetic field pulses applied in the predetermined period PS whose posterior end is the application start timing of the calculation target RF pulse are reflected in the calculation. The sequence correction function 66 determines the predetermined period PS by reflecting exponential decay of each eddy-current magnetic based on a time constant, in such a manner that intensity of zero-order components of respective eddy-current magnetic fields can be calculated with sufficient accuracy. Thus, according to the first embodiment, computation load of calculating intensity of zero-order components of respective eddy-current magnetic field can be appropriately reduced or minimized.

Second Embodiment

In the first embodiment, an example in which (a controlled output waveform of each RF pulse of) a pulse sequence is corrected in the processing circuitry 60 and the corrected pulse sequence is inputted to the hardware side of the control device has been described. In the second embodiment, the RF-pulse waveform generation circuit 54 in the hardware side performs frequency modulation on each analogue pulse waveform signal, and thus, the sequence correction function 66 is omitted.

Accordingly, configuration of the MRI apparatus of the second embodiment is the same as that of the MRI apparatus 10 in the first embodiment described with FIG. 1, except that the sequence correction function 66 is omitted. Therefore, a block diagram is omitted and only the difference between the first and second embodiments will be described by reference to a flowchart (this point holds true for the third embodiment and the fourth embodiment).

Figure 6:
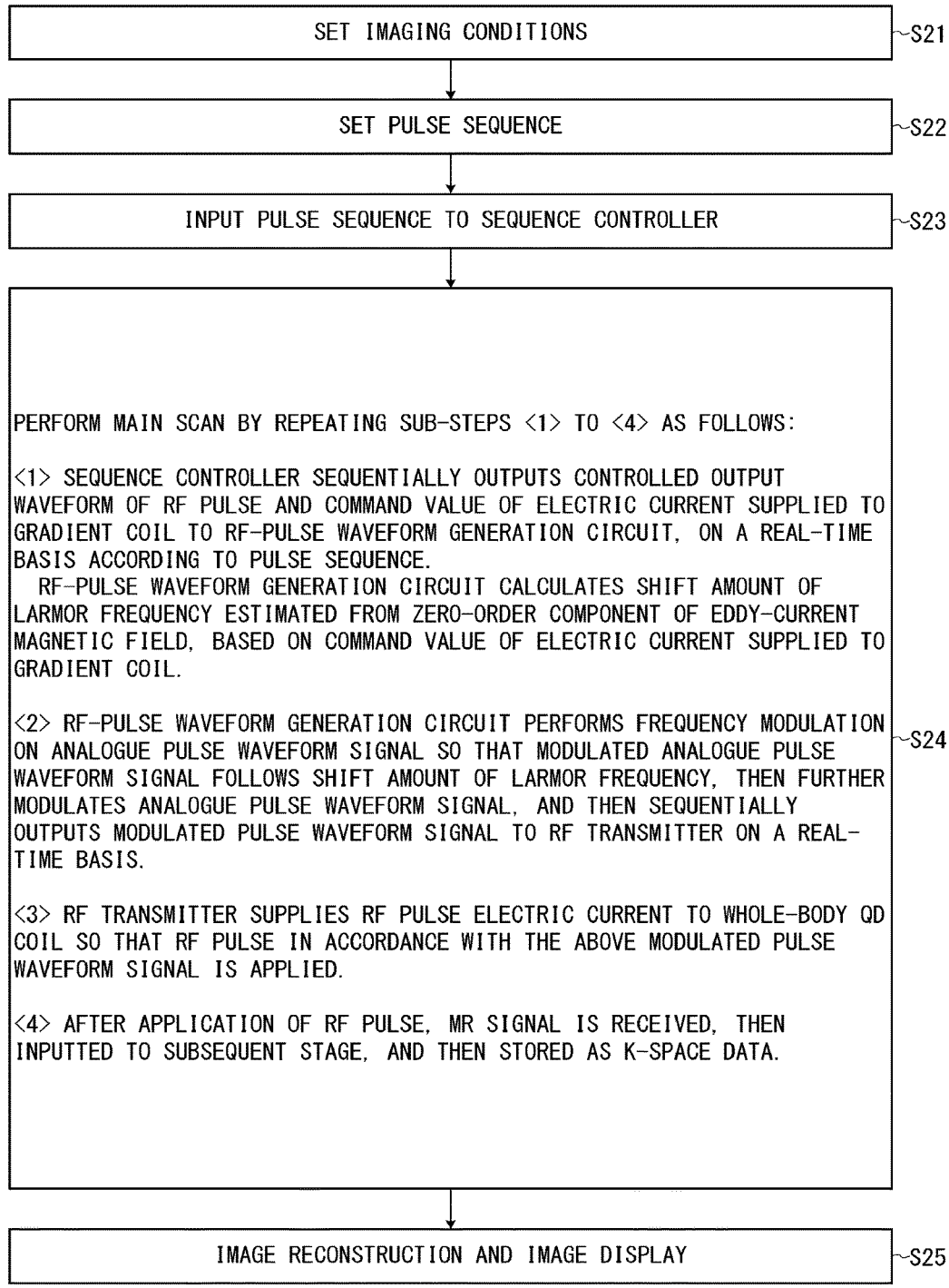
FIG. 6 is a flowchart illustrating an example of a flow of an operation performed by the MRI apparatus of the second embodiment.

FIG. 6 is a flowchart illustrating an example of a flow of an operation performed by the MRI apparatus of the second embodiment. Hereinafter, according to the step numbers in the flowchart of FIG. 6, an operation performed by the MRI apparatus of the second embodiment will be described.

[Steps S21 and S22] Since the processing of the steps S21 and S22 is similar to the processing of the steps S1 and S2 in FIG. 5 described in the first embodiment, duplicate description is omitted.

Afterward, the processing proceeds to the Step S23.

[Step S23] The system control function 61 outputs the pulse sequence, which is set in the step S22, to the sequence controller 58.

Afterward, the processing proceeds to the Step S24.

[Step S24] The static magnetic field formed in the imaging space is uniformed by the shim coil power supply 44 and the shim coil 32 in a manner similar to the first embodiment.

Then, when a command to start imaging is inputted from the input device 72 into the system control function 61 of the processing circuitry 60, the sequence controller 58 drives the respective components of the control device 40 so that the main scan is performed. As an example here, the MRI apparatus performs the main scan by repeating the following sub-steps <1> to <4>.

<1> The sequence controller 58 sequentially supplies electric current values or respective voltage values to the X-axis gradient coil 33x, the Y-axis gradient coil 33y, and the Z-axis gradient coil 33z. The sequence controller 58 further outputs command values (of time variation) of respective electric current values or respective voltage values to the gradient-magnetic-field-pulse waveform generation circuit 47 and the RF-pulse waveform generation circuit 54, on a real-time basis according to the pulse sequence. In synchronization with the above input of the command values, the RF-pulse waveform generation circuit 54 calculates zero-order components of respective eddy-current magnetic fields and the shift amount of the Larmor frequency, based on the command values of electric current or voltage supplied to the X-axis gradient coil 33x, the Y-axis gradient coil 33y, and the Z-axis gradient coil 33y in a manner similar to the first embodiment.

<2> The RF-pulse waveform generation circuit 54 generates an analogue pulse waveform signal and then performs frequency modulation on the analogue pulse waveform signal so that the analogue pulse waveform signal subjected to the frequency modulation follows the shift amount of the Larmor frequency, in a manner similar to the first embodiment. The RF-pulse waveform generation circuit 54 further up-converts the analogue pulse waveform signal, which is frequency modulated, to the carrier frequency inputted from the fixed frequency generation circuit 57 in a similar manner as described above, and outputs the modulated pulse waveform signal to the RF transmitter 48.

<3> The RF transmitter 48 generates an RF pulse electric current based on the inputted pulse waveform signal and transmits the RF pulse electric current to the whole-body QD coil. The whole-body QD coil applies the RF pulse in accordance with the RF pulse electric current to the object P.

<4> After application of the RF pulse in the sub-step <3>, the RF coil 100 receives an MR signal emitted from the object P. The received MR signal is subjected to processing similar to that of the first embodiment, then converted into k-space data, and then stored in the image reconstruction function 62 of the processing circuitry 60.

After completion of acquisition of MR signals of the main scan by sequentially repeating the above sub-steps <1> to <4>, the processing proceeds to the step S25.

[Step S25] Since the processing of the step S25 is similar to the processing of the steps S6 in FIG. 5 described in the first embodiment, duplicate description is omitted.

The foregoing is the description of the flowchart of FIG. 6.

In the MRI apparatus of the second embodiment as described above, the RF-pulse waveform generation circuit 54 sequentially performs frequency modulation on a controlled output waveform of each RF pulse on a real-time basis in such a manner that the controlled output waveform of each RF pulse follows the actual Larmor frequency. Thus, the same effects as the first embodiment can also be obtained in the second embodiment.

Third Embodiment

An example in which controlled output waveforms of respective RF pulses in a pulse sequence are corrected inside the processing circuitry 60 has been described in the first embodiment, and another example in which controlled output waveforms of respective RF pulses in a pulse sequence are corrected by the RF-pulse waveform generation circuit 54 on the hardware side has been described in the second embodiment. As still another example, in the MRI apparatus of the third embodiment, the variable frequency generation circuit 56 performs frequency modulation of Δf on the center frequency of each RF pulse in a pulse sequence without correcting a controlled output waveform of each RF pulse so that the center frequency of each RF pulse subjected to the frequency modulation follows the shift amount of the actual Larmor frequency.

Figure 7:
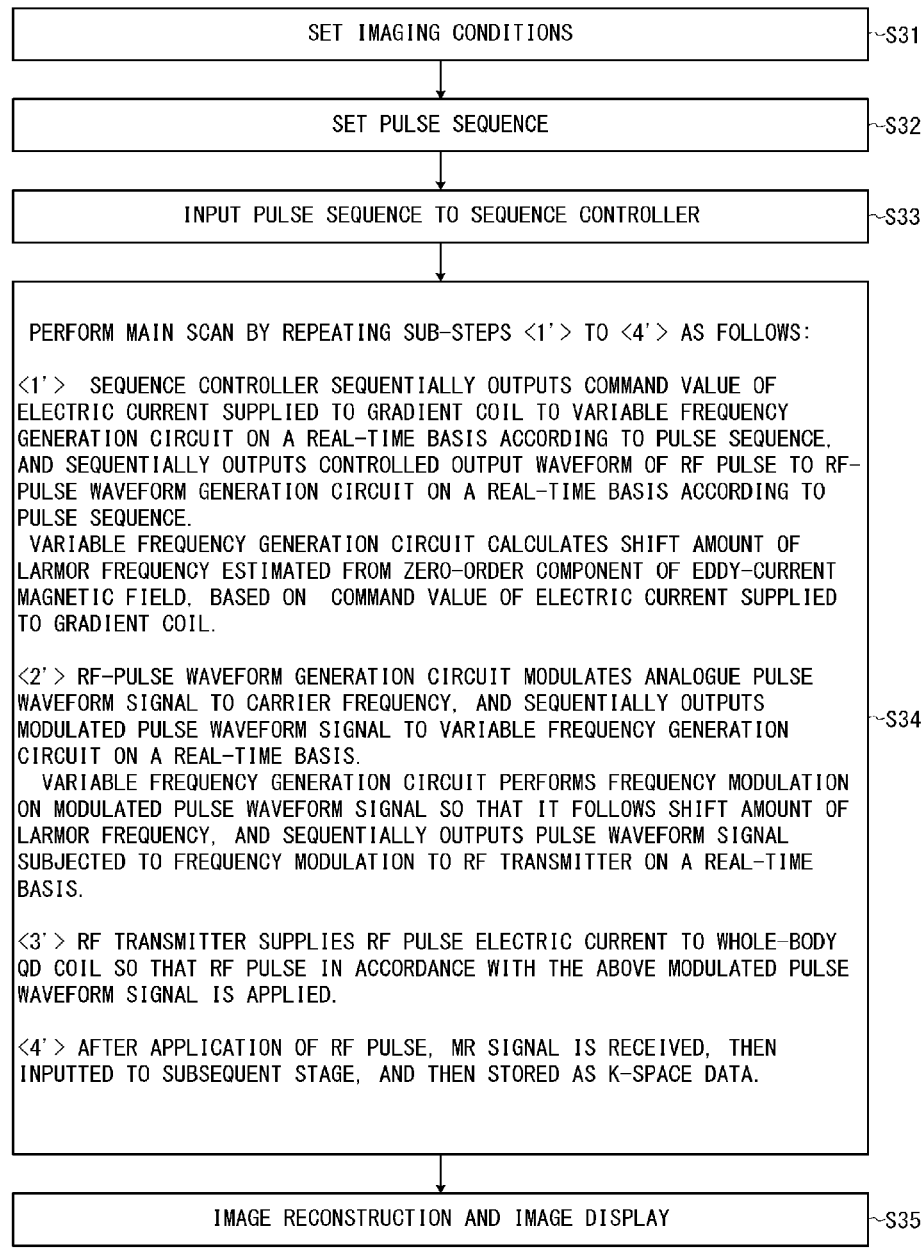
FIG. 7 is a flowchart illustrating an example of a flow of an operation performed by the MRI apparatus of the third embodiment.

FIG. 7 is a flowchart illustrating an example of a flow of an operation performed by the MRI apparatus of the third embodiment. Hereinafter, according to the step numbers in the flowchart of FIG. 7, an operation performed by the MRI apparatus of the second embodiment will be described.

[Steps S31 to S33] Since the processing of the steps S31 to S33 is similar to the processing of the steps S21 to S23 in FIG. 6 described in the second embodiment, duplicate description is omitted.

Afterward, the processing proceeds to the Step S34.

[Step S34] The static magnetic field formed in the imaging space is uniformed by the shim coil power supply 44 and the shim coil 32 in a manner similar to the first embodiment.

Then, when a command to start imaging is inputted from the input device 72 into the system control function 61 of the processing circuitry 60, the sequence controller 58 drives the respective components of the control device 40 according to the inputted pulse sequence so that acquisition of MR signals as the main scan is performed. As an example here, the main scan is performed by sequentially repeating the following sub-steps <1'> to <4'>.

<1'> The sequence controller 58 sequentially outputs command values (of time variation) of respective electric current values or respective voltage value supplied to the X-axis gradient coil 33x, the Y-axis gradient coil 33y, and the Z-axis gradient coil 33y to the gradient-magnetic-field-pulse waveform generation circuit 47 and the RF-pulse waveform generation circuit 54, on a real-time basis according to the pulse sequence. At the same time as the above processing, the sequence controller 58 outputs a controlled output waveform of each RF pulse to the RF-pulse waveform generation circuit 54 on a real-time basis.

In synchronization with the above-described input from the sequence controller 58, the variable frequency generation circuit 56 calculates the shift amount of the Larmor frequency and zero-order components of respective eddy-current magnetic fields based on the command values of electric current or voltage supplied to the X-axis gradient coil 33x, the Y-axis gradient coil 33y, and the Z-axis gradient coil 33z, in a similar manner as described above.

<2'> The RF-pulse waveform generation circuit 54 generates an analogue pulse waveform signal, and then modulates the analogue pulse waveform signal to the carrier frequency inputted from the fixed frequency generation circuit 57 in a manner similar to the first embodiment. The RF-pulse waveform generation circuit 54 outputs the modulated pulse waveform signal to the variable frequency generation circuit 56. The variable frequency generation circuit 56 performs frequency modulation on the pulse waveform signal inputted from the RF-pulse waveform generation circuit 54, in such a manner that the pulse waveform signal subjected to the frequency modulation follows the shift amount of the Larmor frequency calculated in the sub-step <1'>. Then, the variable frequency generation circuit 56 outputs the pulse waveform signal subjected to the frequency modulation to the RF transmitter 48.

<3'> The RF transmitter 48 generates an RF pulse electric current based on the inputted pulse waveform signal and transmits the RF pulse electric current to the whole-body QD coil in a similar manner as described above. The whole-body QD coil applies the RF pulse in accordance with the RF pulse electric current to the object P.

<4'> An MR signal is received and stored as k-space data in a similar manner as described above.

After completion of acquisition of MR signals of the main scan by sequentially repeating the above sub-steps <1'> to <4'>, the processing proceeds to the step S35.

[Step S35] Since the processing of the step S35 is similar to the processing of the steps S6 in FIG. 5 described in the first embodiment, duplicate description is omitted.

The foregoing is the description of the flowchart of FIG. 7.

In the third embodiment, a pulse waveform signal modulated by the RF-pulse waveform generation circuit 54 to the carrier frequency inputted from the fixed frequency generation circuit 57 is inputted to the variable frequency generation circuit 56, then subjected to further frequency modulation so as to follow the shift amount of the Larmor frequency, and then inputted to the RF transmitter 48. Thus, the center frequency of each RF pulse outputted from the RF coil 34 becomes a value which follows the shift of the actual Larmor frequency. Accordingly, the same effects as the first embodiment can also be obtained in the third embodiment.

Fourth Embodiment

In the MRI apparatus of the fourth embodiment, the carrier frequency used for generation of each RF pulse is shifted on the hardware side so as to follow the shift of the Larmor frequency, without correcting a controlled output waveform of each RF pulse in a pulse sequence. As an example here, the fixed frequency generation circuit 57 shifts the carrier frequency so that the shifted carrier frequency follows the shift of the Larmor frequency.

Figure 8:
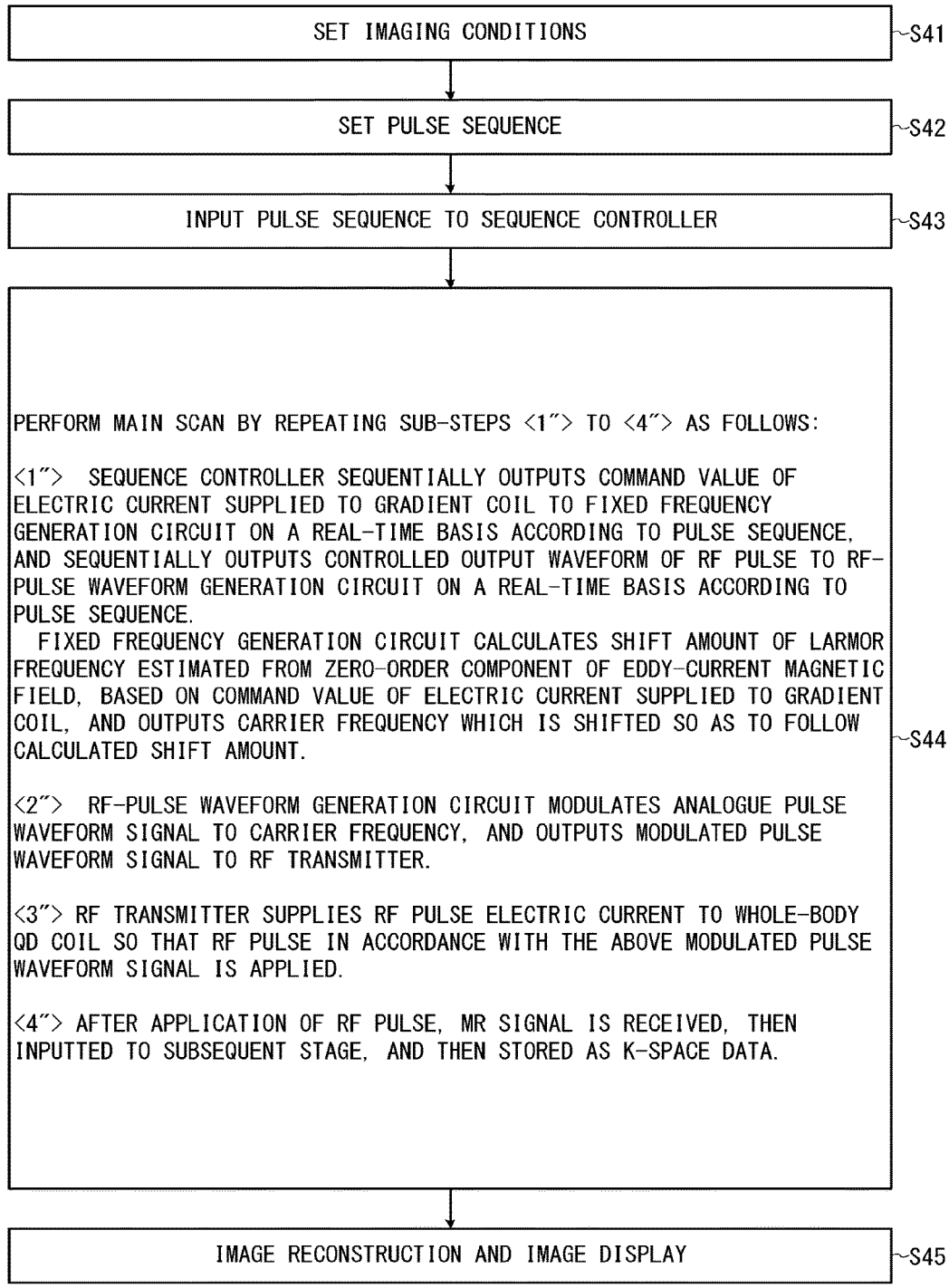
FIG. 8 is a flowchart illustrating an example of a flow of an operation performed by the MRI apparatus of the fourth embodiment.

FIG. 8 is a flowchart illustrating an example of a flow of an operation performed by the MRI apparatus of the fourth embodiment. Hereinafter, according to the step numbers in the flowchart of FIG. 8, an operation performed by the MRI apparatus of the fourth embodiment will be described.

[Steps S41 to S43] Since the processing of the steps S41 to S43 is similar to the processing of the steps S21 to S23 in FIG. 6 described in the second embodiment, duplicate description is omitted.

Afterward, the processing proceeds to the Step S44.

[Step S44] The static magnetic field formed in the imaging space is uniformed by the shim coil power supply 44 and the shim coil 32 in a manner similar to the first embodiment.

Then, when a command to start imaging is inputted from the input device 72 into the system control function 61 of the processing circuitry 60, the sequence controller 58 drives the respective components of the control device 40 according to the inputted pulse sequence so that acquisition of MR signals as the main scan is performed. As an example here, the main scan is performed by sequentially repeating the following sub-steps <1"> to <4">.

<1"> The sequence controller 58 sequentially outputs command values (of time variation) of respective electric current values or respective voltage values supplied to the X-axis gradient coil 33x, the Y-axis gradient coil 33y, and the Z-axis gradient coil 33z to the gradient-magnetic-field-pulse waveform generation circuit 47 and the RF-pulse waveform generation circuit 54, on a real-time basis according to the pulse sequence. At the same time as the above processing, the sequence controller 58 outputs a controlled output waveform of each RF pulse to the RF-pulse waveform generation circuit 54 on a real-time basis.

In synchronization with the above-describe input from the sequence controller 58, the fixed frequency generation circuit 57 sequentially calculates the shift amount of the Larmor frequency and zero-order components of respective eddy-current magnetic fields based on the command values of electric current or voltage supplied to the X-axis gradient coil 33x, the Y-axis gradient coil 33y, and the Z-axis gradient coil 33z, on a real-time basis in a similar manner as described above. The fixed frequency generation circuit 57 generates the carrier frequency whose frequency is shifted so as to follow the calculated shift amount of the Larmor frequency, and sequentially outputs the generated carrier frequency to the RF-pulse waveform generation circuit 54 on a real-time basis.

<2"> The RF-pulse waveform generation circuit 54 generates an analogue pulse waveform signal in a manner similar to the first embodiment, and then modulates the analogue pulse waveform signal to the carrier frequency inputted from the fixed frequency generation circuit 57 (note that the waveform of the RF pulse to be modulated in this sub-step <2"> has been already subjected to frequency shift processing in the sub-step <1"> so as to follow the actual Larmor frequency). The RF-pulse waveform generation circuit 54 outputs the modulated pulse waveform signal to the RF transmitter 48.

<3"> The RF transmitter 48 generates an RF pulse electric current based on the inputted pulse waveform signal and transmits the RF pulse electric current to the whole-body QD coil in a similar manner as described above. The whole-body QD coil applies the RF pulse in accordance with the RF pulse electric current to the object P.

<4"> An MR signal is received and stored as k-space data in a similar manner as described above.

After completion of acquisition of MR signals of the main scan by sequentially repeating the above sub-steps <1"> to <4">, the processing proceeds to the step S45.

[Step S45] Since the processing of the step S45 is similar to the processing of the steps S6 in FIG. 5 described in the first embodiment, duplicate description is omitted.

The foregoing is the description of the flowchart of FIG. 8.

In the fourth embodiment, the carrier frequency to be inputted to the RF-pulse waveform generation circuit 54 is shifted in the former stage so as to follow the shift of the Larmor frequency. Since each RF pulse is generated based on such a carrier frequency, the center frequency of each RF pulse outputted from the RF coil 34 becomes a modulated value which follows the shift of the Larmor frequency (i.e., matches the actual Larmor frequency). Thus, the same effects as the first embodiment can also be obtained in the fourth embodiment.

According to each of the above-described embodiments, a waveform of each RF pulse can be brought close to an intended waveform in MRI.

Supplementary Notes on Embodiments

[1] An example in which the whole-body QD coil of quadrature phase type in the RF coil 34 is used as an RF coil for applying RF pulses has been described in each of the above-described embodiments. However, embodiments of the present invention are not limited to such an aspect. The technology of performing frequency modulation on a controlled output waveform of each RF pulse in each of the above-described embodiments can be applied not only to an RF coil of quadrature phase type but also to any other RF coil which apply RF pulses in a different method.

[2] Correspondences between terms used in the claims and terms used in the embodiments described above will be described. Note that the correspondences described below are just some of possible interpretations for reference and should not be construed as limiting the present invention.

The entirety of the gradient-magnetic-field-pulse waveform generation circuit 47, the gradient coil power supply 46, and the gradient coil 33 is an example of the gradient magnetic field generation circuit described in the claims.

In the first embodiment, the entirety of the sequence correction function 66, the sequence controller 58, the variable frequency generation circuit 56, the RF-pulse waveform generation circuit 54, the RF transmitter 48, and the RF coil 34 is an example of the RF transmission circuit described in the claims.

In the second to the fourth embodiments, the entirety of the sequence controller 58, the variable frequency generation circuit 56, the RF-pulse waveform generation circuit 54, the RF transmitter 48, and the RF coil 34 is an example of the RF transmission circuit described in the claims.

The system control function 61 which acquires imaging conditions via the input device 72 and sets a pulse sequence based on the imaging conditions is an example of functions implemented by the processing circuitry described in the claims.

[3] While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An MRI apparatus, comprising:
a gradient generation circuit configured to apply a gradient pulse according to a pulse sequence in which application of an RF pulse and application of the gradient pulse are included; and
an RF transmission circuit configured to
perform modulation on a controlled output waveform of the RF pulse, in such a manner that the controlled output waveform of the RF pulse follows A time variation of a magnetic resonance frequency caused by a time variation of an eddy-current magnetic field estimated from a waveform of the gradient pulse, and
apply the RF pulse subjected to the modulation to an object,
wherein the RF transmission circuit is further configured to perform frequency modulation of changing a center frequency at each application timing of the RF pulse and within the pulse-duration thereof, in such a manner that each frequency within the pulse-duration follows a time variation of a Larmor frequency inside the object in an imaging region, the time variation of the Larmor frequency being estimated from a zero-order component of the eddy-current magnetic field.

2. The MRI apparatus according to claim 1,
wherein the RF transmission circuit is further configured to perform the modulation in such a manner that the center frequency of the RF pulse is brought closer to the Larmor frequency inside the imaging region, which is estimated from a zero-order component of the eddy-current magnetic field.

3. The MRI apparatus according to claim 1, further comprising processing circuitry configured to acquire imaging conditions and set the pulse sequence based on the imaging conditions,
wherein the RF transmission circuit is further configured to
calculate a zero-order component of the eddy-current magnetic field based on a waveform of the gradient pulse obtained from conditions of the pulse sequence, and correct the pulse sequence by performing frequency modulation based on the zero-order component of the eddy-current magnetic field.

4. The MRI apparatus according to claim 3, wherein the RF transmission circuit is configured to
- calculate the zero-order component of each eddy-current magnetic field caused by every gradient pulse applied during a predetermined period prior to the application of the RF pulse, for each RF pulse included in the pulse sequence, and
- correct a controlled output waveform of each RF pulse included in the pulse sequence by performing the frequency modulation based on the zero-order component of each eddy-current magnetic field calculated for each RF pulse.

5. The MRI apparatus according to claim 1, further comprising processing circuitry configured to set conditions of the pulse sequence,
- wherein the gradient generation circuit includes a gradient coil configured to apply the gradient magnetic field pulse;
- the processing circuitry is configured to set the conditions of the pulse sequence, the conditions including a controlled output waveform of each RF pulse and each command value of electric current or voltage supplied to the gradient coil, based on imaging conditions; and
- the RF transmission circuit is further configured to sequentially perform first processing, second processing, and third processing on a real-time basis each time the RF pulse is applied in the pulse sequence,
- the first processing being processing of acquiring the zero-order component of the eddy-current magnetic field obtained from each command value of electric current or voltage supplied to the gradient coil defined in the pulse sequence,
- the second processing being processing of performing the frequency modulation on the controlled output waveform of the RF pulse based on the zero-order component of the eddy-current magnetic field, and
- the third processing being processing of outputting the RF pulse subjected to the frequency modulation.

6. The MRI apparatus according to claim 5, wherein the RF transmission circuit is further configured to
- calculate the zero-order component of each eddy-current magnetic field caused by every gradient pulse applied during a predetermined period prior to the application of the RF pulse, for each RF pulse included in the pulse sequence, and
- perform the frequency modulation for each RF pulse, based on the zero-order component of each eddy-current magnetic field calculated for each RF pulse.

7. The MRI apparatus according to claim 1, wherein the RF transmission circuit is further configured to
- store a time constant of decay of a zero-order component of the eddy-current magnetic field before execution of the pulse sequence, and
- calculate the zero-order component of the eddy-current magnetic field based on the time constant and a waveform of the gradient magnetic field pulse.

* * * * *